(12) United States Patent
Takakura et al.

(10) Patent No.: US 10,483,967 B2
(45) Date of Patent: Nov. 19, 2019

(54) SWITCHING ELEMENT DRIVING CIRCUIT

(71) Applicant: AISIN AW CO., LTD., Anjo-shi, Aichi-ken (JP)

(72) Inventors: Yuji Takakura, Anjo (JP); Yasushi Nakamura, Nishio (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 16/310,167

(22) PCT Filed: Jul. 26, 2017

(86) PCT No.: PCT/JP2017/027059
§ 371 (c)(1),
(2) Date: Dec. 14, 2018

(87) PCT Pub. No.: WO2018/055900
PCT Pub. Date: Mar. 29, 2018

(65) Prior Publication Data
US 2019/0326904 A1    Oct. 24, 2019

(30) Foreign Application Priority Data

Sep. 23, 2016 (JP) .................................. 2016-185833

(51) Int. Cl.
*H03K 3/00*       (2006.01)
*H03K 17/687*  (2006.01)
*H02M 1/08*    (2006.01)
H02M 3/335     (2006.01)
H02P 27/06     (2006.01)
H02M 7/5387   (2007.01)

(52) U.S. Cl.
CPC ............ *H03K 17/687* (2013.01); *H02M 1/08* (2013.01); *H02M 3/33507* (2013.01); *H02M 7/53871* (2013.01); *H02P 27/06* (2013.01)

(58) Field of Classification Search
CPC ......... H01L 2924/00; H01L 2924/0002; H01L 2924/13091; H01L 2924/00014
See application file for complete search history.

(56) References Cited

U.S. PATENT DOCUMENTS 6,333,665 B1 * 12/2001 Ichikawa ............. H03K 17/168
327/389
2012/0025875 A1   2/2012 Fukuta et al.
2014/0091324 A1   4/2014 Zushi et al.

FOREIGN PATENT DOCUMENTS

JP    H03-141720 A    6/1991
JP    2000-253646 A   9/2000
JP    2004-242475 A   8/2004
(Continued)

OTHER PUBLICATIONS

Sep. 5, 2017 International Search Report issued in International Patent Application No. PCT/JP2017/027059.

*Primary Examiner* — Sibin Chen
(74) *Attorney, Agent, or Firm* — Oliff PLC

(57) ABSTRACT

A switching element driving circuit that includes a push-pull buffer circuit driving a switching element to be driven, the push-pull buffer circuit amplifying electrical power of a switching control signal and transmitting the amplified switching control signal to a control terminal of the switching element to be driven; a compensation resistor that connects the input to the output; and an input-side pull-down resistor that connects the input to a negative polarity side of the switching element to be driven.

3 Claims, 7 Drawing Sheets

(56) References Cited

FOREIGN PATENT DOCUMENTS

| | | |
|---|---|---|
| JP | 2012-034450 A | 2/2012 |
| JP | 2013-062965 A | 4/2013 |
| JP | 2015-205574 A | 11/2015 |

* cited by examiner

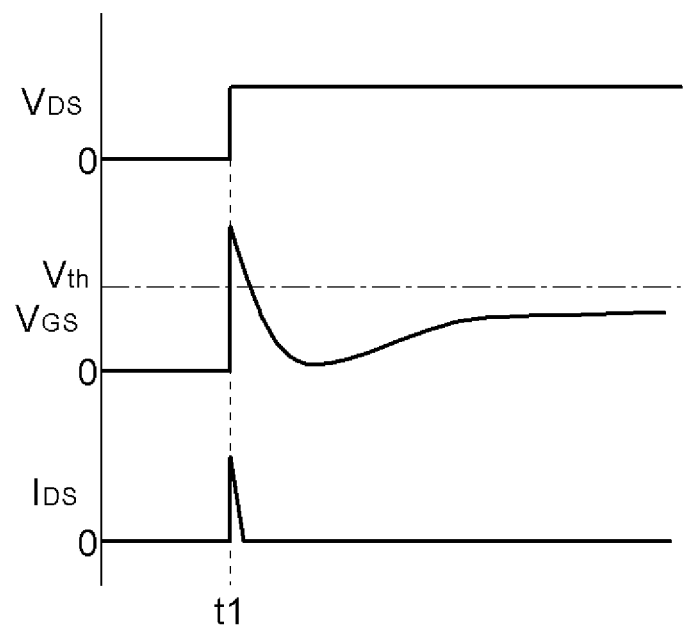

SWITCHING ELEMENT DRIVING CIRCUIT

BACKGROUND

The present disclosure relates to a switching element driving circuit that amplifies a switching control signal and drives a switching element.

To drive a switching element of an inverter that converts electrical power between direct current and alternating current, a drive circuit that amplifies electrical power of a switching control signal generated by a control circuit may be provided. As such a drive circuit, a push-pull circuit such as that described in JP 2004-242475 A may be used (see reference sign 10a of FIG. 1, [0030], etc.). Meanwhile, when the inverter drives a high-output electrical apparatus, a direct-current side voltage may be a high voltage on the order of 200 to 400 [V]. Such high-voltage direct-current electrical power is supplied from a so-called high-voltage direct-current power supply. On the other hand, the control circuit that generates a switching control signal generally has an operating voltage of 5 V or less, and in many cases, electrical power is supplied from a low-voltage direct-current power supply with a much lower voltage than the high-voltage direct-current power supply. The amplitude of an amplified signal outputted from the drive circuit is on the order of about 10 to 20 V in many cases, and an operating voltage of the drive circuit is generated from the low-voltage direct-current power supply in many cases.

Here, when an event occurs in which an appropriate voltage is not outputted from the low-voltage direct-current power supply or a power supply circuit that generates an operating voltage of the drive circuit from the low-voltage direct-current power supply, the switching element may not be able to be stably controlled. It is not desirable that control of the inverter become unstable when a high voltage is applied to the inverter. Therefore, it is desirable to fix at least the switching element of the inverter in an off state. However, if the operating voltage of the drive circuit is insufficient, then even if the switching element can be placed in an off state, the switching element may go into an on state due to noise, etc. If, in that state, electrical power from the direct-current power supply or induced electromotive force from a device to be driven is supplied to the inverter, then a very large current flows through the switching element and thus it is not desirable.

SUMMARY

In view of the above-described background, provision of a technique is desired in which even when electrical power supply to a driving circuit that amplifies a switching control signal and transmits the amplified switching control signal to a switching element is stopped, the switching element can be appropriately controlled to an off state.

One aspect of a switching element driving circuit that takes into account the above-described respects is a switching element driving circuit including a push-pull buffer circuit driving a switching element to be driven, the push-pull buffer circuit amplifying electrical power of a switching control signal and transmitting the amplified switching control signal to a control terminal of the switching element to be driven, wherein, in the push-pull buffer circuit, switching elements of different polarities are connected in series, as buffer elements, between a first potential and a second potential lower in potential than the first potential; a connecting point between control terminals of an upper-stage buffer on a side of the first potential and a lower-stage buffer on a side of the second potential serves as an input; a connecting point between input and output terminals of the upper-stage buffer and the lower-stage buffer serves as an output; an upper-stage current limiting resistor is provided between the first potential and the upper-stage buffer; a lower-stage current limiting resistor is provided between the second potential and the lower-stage buffer; the switching control signal is inputted to the input; and the output is connected to the control terminal of the switching element to be driven, the switching element driving circuit further includes: a compensation resistor that connects the input to the output; and an input-side pull-down resistor that connects the input to a negative polarity side of the switching element to be driven, and a sum of a resistance value of the compensation resistor and a resistance value of the input-side pull-down resistor is set to be smaller than a resistance value between the control terminal of the switching element to be driven and an emitter terminal or a source terminal of the switching element, and to be larger than a resistance value of the lower-stage current limiting resistor.

When a voltage is applied between the input and output terminals (between a drain and a source or between a collector and an emitter) of a switching element to be driven, due to floating capacitances at a control terminal (a gate terminal or a base terminal), a driving voltage at the control terminal (a gate-source voltage, a gate-emitter voltage, or a base-emitter voltage) may suddenly increase. The switching element driving circuit of this configuration includes a series circuit of the compensation resistor and the input-side pull-down resistor between the control terminal and the negative polarity. The sum of the resistance value of the compensation resistor and the resistance value of the input-side pull-down resistor is smaller than a resistance value between the control terminal and an emitter terminal or a source terminal of the switching element. Therefore, charge of the parasitic capacitances is discharged to the negative polarity of the switching element to be driven, through the compensation resistor and the input-side pull-down resistor. At this time, a potential difference occurs between both ends of the compensation resistor by a current flowing through the compensation resistor, and the lower-stage buffer of the push-pull buffer circuit transitions to an on state. The resistance value of the lower-stage current limiting resistor is smaller than the sum of the resistance value of the compensation resistor and the resistance value of the input-side pull-down resistor. Therefore, when the lower-stage buffer transitions to an on state, the charge of the floating capacitances and a leakage current flowing through the switching element to be driven flow through the lower-stage buffer and the lower-stage current limiting resistor. By this, a voltage that allows the switching element to be driven to transition to an on state is suppressed from occurring at the control terminal of the switching element. As such, according to this configuration, even when electrical power supply to the driving circuit that amplifies a switching control signal and transmits the amplified switching control signal to the switching element is stopped, the switching element can be appropriately controlled to an off state.

Further features and advantages of the switching element driving circuit will become apparent from the following description of an embodiment which will be described with reference to the drawings.

BRIEF DESCRIPTION OF THE DRAWINGS

FIG. 10 is a timing chart showing an example of the behavior of the switching element to be driven by the driving circuit of the comparison example.

DETAILED DESCRIPTION OF EMBODIMENTS

Figure 1:
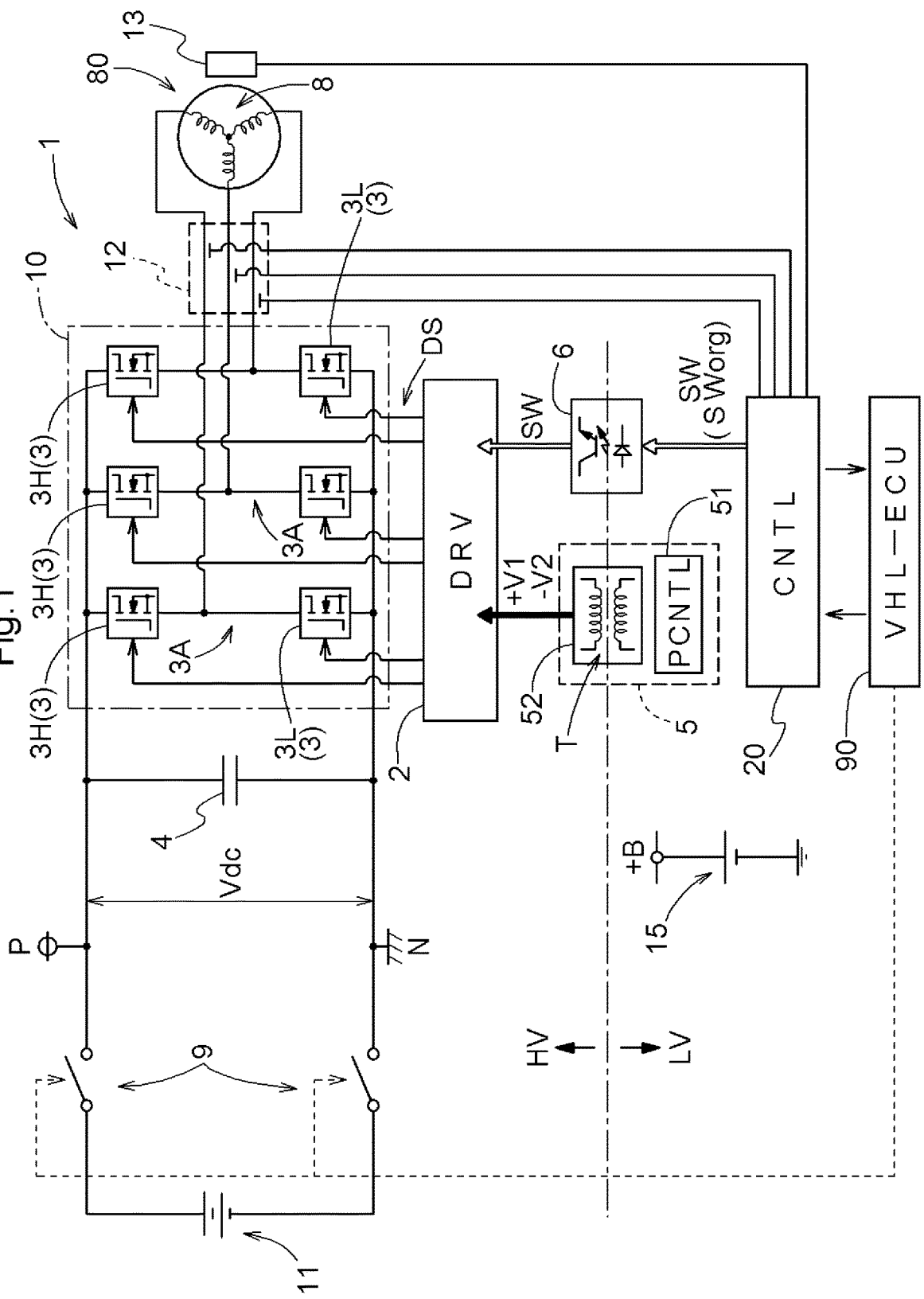
FIG. 1 is a circuit block diagram showing an example of a system configuration of a rotating electrical machine control apparatus.

Using, as an example, a mode of application to a rotating electrical machine control apparatus that controls the drive of a rotating electrical machine, an embodiment of a switching element driving circuit will be described below based on the drawings. A circuit block diagram of FIG. 1 schematically shows a system configuration of a rotating electrical machine control apparatus 1. As shown in FIG. 1, the rotating electrical machine control apparatus 1 includes an inverter 10 that converts electrical power between direct-current electrical power and alternating-current electrical power of a plurality of phases. In the present embodiment, the inverter 10 is exemplified that is connected to an alternating-current rotating electrical machine 80 and a high-voltage battery 11 (high-voltage direct-current power supply) and converts electrical power between alternating current of a plurality of phases and direct current. The inverter 10 is connected to the high-voltage battery 11 through contactors 9, and connected to the alternating-current rotating electrical machine 80 and converts electrical power between direct current and alternating current of a plurality of phases (here, three-phase alternating current). The inverter 10 includes a plurality of (here, three) arms 3A, each for one phase of alternating current and each including a series circuit of an upper-stage switching element 3H and a lower-stage switching element 3L. Each of the switching elements 3 (the upper-stage switching element 3H and the lower-stage switching element 3L) corresponds to a switching element to be driven by a switching element driving circuit (driving circuit 2 (DRV)).

Note that although in the present embodiment the alternating-current rotating electrical machine 80 is exemplified as an alternating-current electrical apparatus, other electrical apparatuses than a rotating electrical machine such as a compressor or a pump may be used. Note also that although in the present embodiment the inverter 10 that includes the plurality of arms 3A and converts electrical power between alternating-current electrical power of a plurality of phases and direct-current electrical power is exemplified, the inverter 10 may include only one arm 3A and convert electrical power between single-phase alternating-current electrical power and direct-current electrical power.

The rotating electrical machine 80 can be, for example, a drive power source for a vehicle such as a hybrid vehicle or an electric vehicle. In addition, the rotating electrical machine 80 can also function as an electric motor and as a generator. The rotating electrical machine 80 converts electrical power supplied from the high-voltage battery 11 through the inverter 10 into mechanical power that drives wheels of a vehicle (motoring). Alternatively, the rotating electrical machine 80 converts rotary drive power transmitted from an internal combustion engine or wheels which is not shown into electrical power and charges the high-voltage battery 11 through the inverter 10 (regeneration). The high-voltage battery 11 is composed of, for example, a secondary battery (battery) such as a nickel-hydrogen battery or a lithium-ion battery, or an electric double-layer capacitor. When the rotating electrical machine 80 is a drive power source for a vehicle, the high-voltage battery 11 is a high-voltage, high-capacity direct-current power supply, and the rated power supply voltage is, for example, 200 to 400 [V].

A voltage between a positive-polarity power line P and a negative-polarity power line N on a direct current side of the inverter 10 is hereinafter referred to as direct-current link voltage Vdc. On the direct current side of the inverter 10 there is provided a smoothing capacitor (direct-current link capacitor 4) that smooths the direct-current link voltage Vdc. The direct-current link capacitor 4 stabilizes a direct-current voltage (direct-current link voltage Vdc) that fluctuates according to the fluctuations of electrical power consumption of the rotating electrical machine 80.

As shown in FIG. 1, the contactors 9 are provided between the high-voltage battery 11 and the inverter 10. Specifically, the contactors 9 are disposed between the direct-current link capacitor 4 and the high-voltage battery 11. The contactors 9 can disconnect an electrical connection between an electrical circuit system (the direct-current link capacitor 4 and the inverter 10) of the rotating electrical machine control apparatus 1 and the high-voltage battery 11. Namely, the inverter 10 is connected to the rotating electrical machine 80, and connected to the high-voltage battery 11 through the contactors 9. When the contactors 9 are in a connected state (closed state), the high-voltage battery 11 and the inverter 10 (and the rotating electrical machine 80) are electrically connected to each other, and when the contactors 9 are in a released state (open state), the electrical connection between the high-voltage battery 11 and the inverter 10 (and the rotating electrical machine 80) is cut off.

In the present embodiment, the contactors 9 are mechanical relays that open and close based on an instruction from a vehicle ECU (VHL-ECU: Vehicle Electronic Control Unit) 90 which is one of host control apparatuses in the vehicle, and are referred to as, for example, system main relays (SMR). When a vehicle's ignition key (IG key) is in an on state (effective state), relay contacts close and the contactors 9 go into a conduction state (connected state), and when the IG key is in an off state (ineffective state), the relay contacts open and the contactors 9 go into a non-conduction state (released state).

Figure 2:
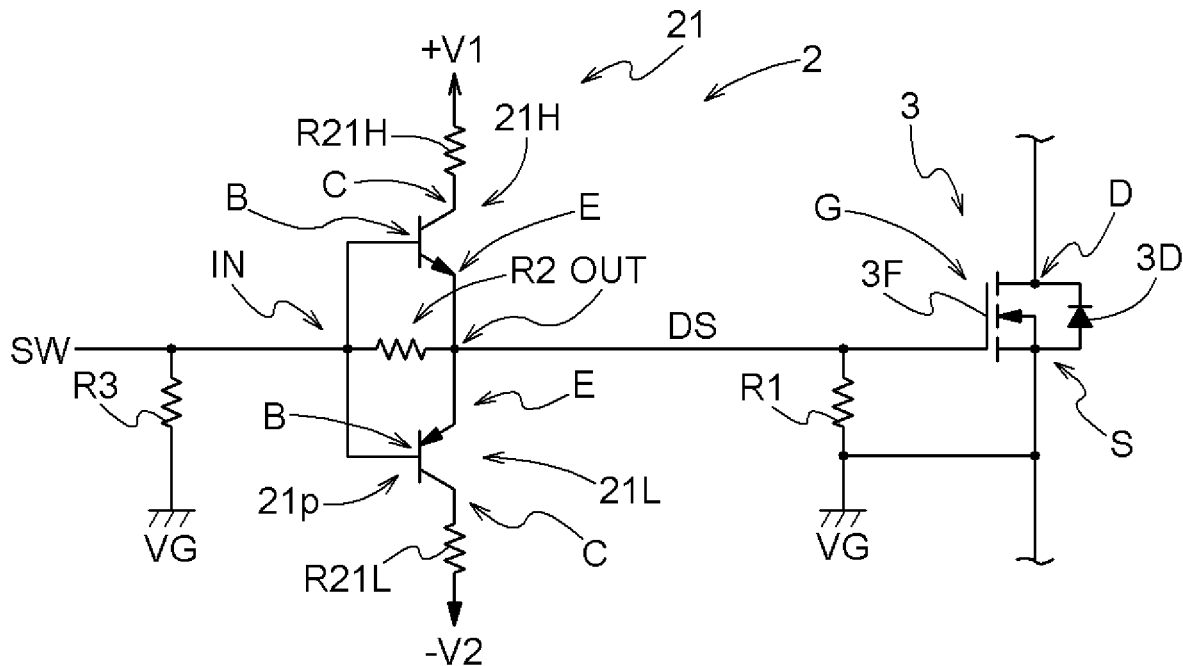
FIG. 2 is a schematic circuit diagram showing an exemplary configuration of a driving circuit.

As described above, the inverter 10 converts direct-current electrical power having a direct-current link voltage Vdc into alternating-current electrical power of a plurality of phases (n phases with n being a natural number, here, three phases) and supplies the alternating-current electrical power to the rotating electrical machine 80, and converts alternating-current electrical power generated by the rotating electrical machine 80 into direct-current electrical power and supplies the direct-current electrical power to the direct-current power supply. The inverter 10 is configured to include the plurality of switching elements 3. For the switching elements 3, it is preferred to apply a power semiconductor device that can operate at high frequencies such as an insulated gate bipolar transistor (IGBT), a power metal oxide semiconductor field effect transistor (MOSFET), a silicon carbide-metal oxide semiconductor FET (SiC-MOSFET), a SiC-static induction transistor (SiC-SIT), or gallium nitride-MOSFET (GaN-MOSFET). As shown in FIGS. 1 and 2, in the present embodiment, MOSFETs (preferably, SiC-MOSFETs) are used as the switching elements 3.

As shown in FIG. 2, in the present embodiment, each switching element 3 is configured to include an n-channel MOSFET 3F and a freewheeling diode 3D which will be described later. In the present embodiment, a gate bias resistor R1 (control terminal bias resistor) is connected between a gate terminal G and a source terminal S of the MOSFET 3F. There is no problem even if the gate bias resistor R1 is not provided. In that case, the resistance value between a control terminal (gate terminal G) of the switching element 3 (MOSFET 3F) and the source terminal S of the switching element 3 (MOSFET 3F) is infinite (open). As a matter of course, when the gate bias resistor R1 is provided, the resistance value between the control terminal (gate terminal G) of the switching element 3 (MOSFET 3F) and the source terminal S of the switching element 3 (MOSFET 3F) is equivalent to the resistance value of the gate bias resistor R1. Though not shown, when a switching element 3 to be driven is an IGBT and has a gate bias resistor R1, the resistance value between a control terminal (gate terminal) of the IGBT and an emitter terminal of the switching element 3 (IGBT) is equivalent to the resistance value of the gate bias resistor R1. As a matter of course, when a switching element 3 to be driven is an IGBT and does not have a gate bias resistor R1, the resistance value between a control terminal (gate terminal) of the IGBT and an emitter terminal of the switching element 3 (IGBT) is infinite (open).

As is well known, the inverter 10 includes a bridge circuit having the arms 3A, the number of which corresponds to the number of a plurality of phases. In the present embodiment, a bridge circuit is formed in which one series circuit (arm 3A) is provided for each of stator coils 8 for the U-, V-, and W-phases of the rotating electrical machine 80. A midpoint of each arm 3A, i.e., a connecting point between a switching element 3 on the side of the positive-polarity power line P (upper-stage switching element 3H) and a switching element 3 on the side of the negative-polarity power line N (lower-stage switching element 3L), is connected to a corresponding one of the three-phase stator coils 8 of the rotating electrical machine 80. Note that the switching elements 3 include the freewheeling diodes 3D in parallel iii a forward direction which is a direction going from the negative polarity (N) to the positive polarity (P) (a direction going from the lower stage side to the upper stage side) (see FIG. 2).

As shown in FIG. 1, the inverter 10 is controlled by an inverter control apparatus (CNTL) 20. The inverter control apparatus 20 is constructed using a logic processor such as a microcomputer as a core member. For example, the inverter control apparatus 20 controls the rotating electrical machine 80 through the inverter 10 by performing current feedback control using a vector control method, based on a target torque of the rotating electrical machine 80 which is provided as a request signal from other control apparatuses, etc., such as the vehicle ECU 90. Actual currents flowing through the stator coils 8 for the respective phases of the rotating electrical machine 80 are detected by a current sensor 12, and the inverter control apparatus 20 obtains results of the detection. In addition, a magnetic pole position at each time point of a rotor of the rotating electrical machine 80 is detected by a rotation sensor 13, e.g., a resolver, and the inverter control apparatus 20 obtains a result of the detection. The inverter control apparatus 20 performs current feedback control using the results of the detection obtained by the current sensor 12 and the rotation sensor 13. The inverter control apparatus 20 is configured to include various functional parts for current feedback control, and each functional part is implemented by the cooperation of hardware such as a microcomputer and software (program). The current feedback control is publicly known and thus a detailed description thereof is omitted here.

Meanwhile, the control terminal of each switching element 3 (e.g., a gate terminal G of a MOSFET) included in the inverter 10 is connected to the inverter control apparatus 20 through a driving circuit 2 (switching element driving circuit), and switching control of the switching elements 3 is individually performed. The vehicle ECU 90 and the inverter control apparatus 20 that generates a switching control signal SW (SWorg) are formed as a low-voltage system circuit LV, using a microcomputer, etc., as a core. The low-voltage system circuit LV greatly differs in operating voltage (the power supply voltage of the circuit) from a high-voltage system circuit HV for driving the rotating electrical machine 80, such as the inverter 10. In many cases, the vehicle is equipped with not only the high-voltage battery 11 but also a low-voltage battery 15 (low-voltage direct-current power supply) which is a power supply with a lower voltage (+B: e.g., 12 to 24 [V]) than the high-voltage battery 11. The operating voltages of the vehicle ECU 90 and the inverter control apparatus 20 are, for example, 5 [V] or 3.3 [V], and the vehicle ECU 90 and the inverter control apparatus 20 operate by electrical power supply from a power supply circuit (not shown) such as a voltage regulator that generates those voltages based on electrical power of the low-voltage battery 15.

Hence, the rotating electrical machine control apparatus 1 includes a driving circuit 2 that improves each driving capability (capabilities to allow a circuit in a subsequent stage to operate, e.g., voltage amplitude and output current) of a switching control signal SW (in the case of a MOSFET, a gate driving signal) for each switching element 3, and relays the switching control signal SW (i.e., amplifies the switching control signal SW). A switching control signal SW generated by the inverter control apparatus 20 in the low-voltage system circuit LV is supplied through a driving circuit 2 to the inverter 10 as a driving signal DS for the high-voltage system circuit HV. The driving circuits 2 are provided for the respective switching elements 3. In the present embodiment, the inverter 10 includes six switching elements 3 to be driven and also includes six driving circuits 2 (see, for example, FIG. 7). As will be described later, in the present embodiment, each driving circuit 2 is configured to include a push-pull buffer circuit 21 that amplifies electrical power of a switching control signal SW and transmits the amplified switching control signal SW to a control terminal (gate terminal G) of a switching element 3 to be driven (see FIG. 2).

Meanwhile, the low-voltage system circuit LV and the high-voltage system circuit HV are, in many cases, isolated from each other. In the present embodiment, too, as shown in FIG. 1, the low-voltage system circuit LV and the high-voltage system circuit HV are isolated from each other by isolation elements such as photocouplers 6 and transformers T. A switching control signal SW (original signal) generated by the inverter control apparatus 20 is, strictly speaking, "SWorg", but when viewed from the driving circuit 2, a signal on the output side of the photocoupler 6 also corresponds to an original signal. Thus, unless a particular distinction is required, signals are not distinguished before and after the photocoupler 6, and a signal (SW) on the output side of the photocoupler 6 is described as a switching control signal SW (original signal).

Meanwhile, some driving circuits 2 require a negative power supply for obtaining an output required to control a switching element 3. For example, when the switching element 3 is an IGBT, such a negative power supply is less likely to be required, but when the switching element 3 is a SiC-MOSFET, such a negative power supply is often required.

The switching element 3 is controlled to an on state when the signal level of a driving signal DS is, for example, 15 to 20 [V] with reference to the potential of a terminal on the negative polarity side of the switching element 3 (referred to as virtual ground VG), and is controlled to an off state when the signal level is 0 [V]. The switching element 3 also operates in a non-saturation region between a complete on state (operation in a saturation region) and a complete off state. When the signal level of the driving signal DS exceeds a threshold voltage $V_{th}$ lower than 15 [V] (see FIG. 3, etc.), the switching element 3 starts its operation in a non-saturation region from an off state. A SiC-MOSFET which is one of devices whose actual use has been increasing in recent years has a lower threshold voltage $V_{th}$ than an IGBT has. For example, the threshold voltage of the IGBT is on the order of 5 to 7 [V] and the threshold voltage of the SiC-MOSFET is on the order of 1 to 3 [V].

Hence, when the switching element 3 is a SiC-MOSFET, the switching element 3 is stably controlled to an on state when the signal level of the driving signal DS with reference to the potential (virtual ground VG) of the terminal on the negative polarity side of the switching element 3 is, for example, 15 to 20 [V], but when the signal level is 0 [V], the switching element 3 may not be stably controlled to an off state due to the influence of noise, etc. To appropriately control the switching element 3 to an off state, it is preferred to set the signal level of the driving signal DS to be a lower potential than the potential (virtual ground VG) of the terminal on the negative polarity side of the switching element 3. For example, by providing a driving signal DS with a signal level on the order of "−5 [V]" with reference to the potential (virtual ground VG) of the terminal on the negative polarity side of the switching element 3, the same noise margin as that for the IGBT can be secured (1 to 3 [V]+5 [V]=6 to 8 [V]).

The SiC-MOSFET has a higher switching speed and a smaller switching loss compared with the IGBT. In addition, since the SiC-MOSFET can also achieve miniaturization, the number of cases in which SiC-MOSFETs are adopted as the switching elements 3 in the inverter 10 instead of IGBTs is increasing. Hence, it is desirable that the driving circuit 2 be able to appropriately control the driving of the switching element 3 even when a SiC-MOSFET is applied as the switching element 3.

In the present embodiment, the SiC-MOSFETs are exemplified as the switching elements 3 included in the inverter 10. Therefore, the driving circuits 2 are configured to output a driving signal DS whose signal level is negative relative to the virtual ground VG, and the driving circuits 2 require a negative power supply for the virtual ground VG (second driving voltage generator circuit 5L which will be described later: see FIG. 5). Here, a potential that controls the switching element 3 to an on state (corresponding to the above-described potential on the order of about 15 to 20 [V]) is referred to as first potential "+V1". The first potential "+V1" is a positive potential relative to the potential (virtual ground VG) of the terminal on the negative polarity side of the switching element 3. In addition, a potential that controls the switching element 3 to an off state is referred to as second potential "−V2". The second potential "−V2" is a negative potential relative to the potential (virtual ground VG) of the terminal on the negative polarity side of the switching element 3. The driving voltage generator circuits 5 generate the first potential "+V1" and the second potential "−V2" from the low-voltage battery 15 (second direct-current power supply) lower in rated voltage than the high-voltage battery 11 (first direct-current power supply).

Figure 4:
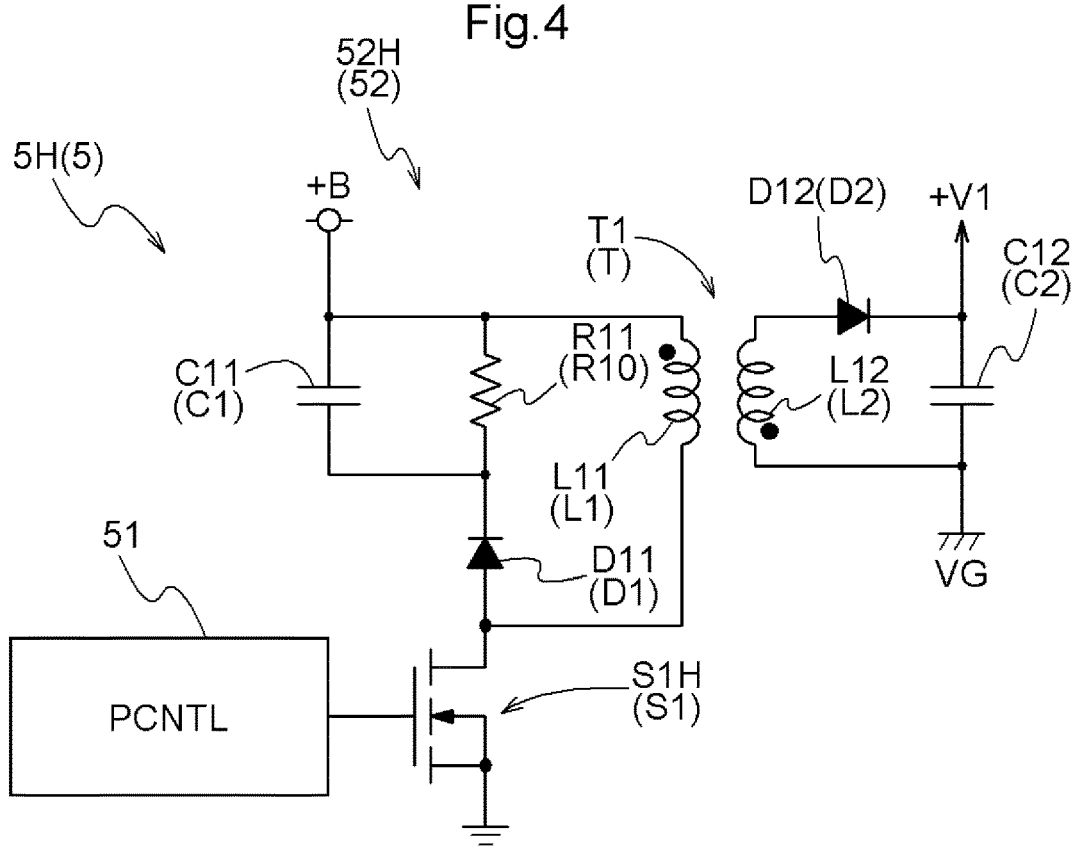
FIG. 4 is a schematic circuit block diagram showing an exemplary configuration of an upper-stage driving voltage generator circuit.
Figure 5:
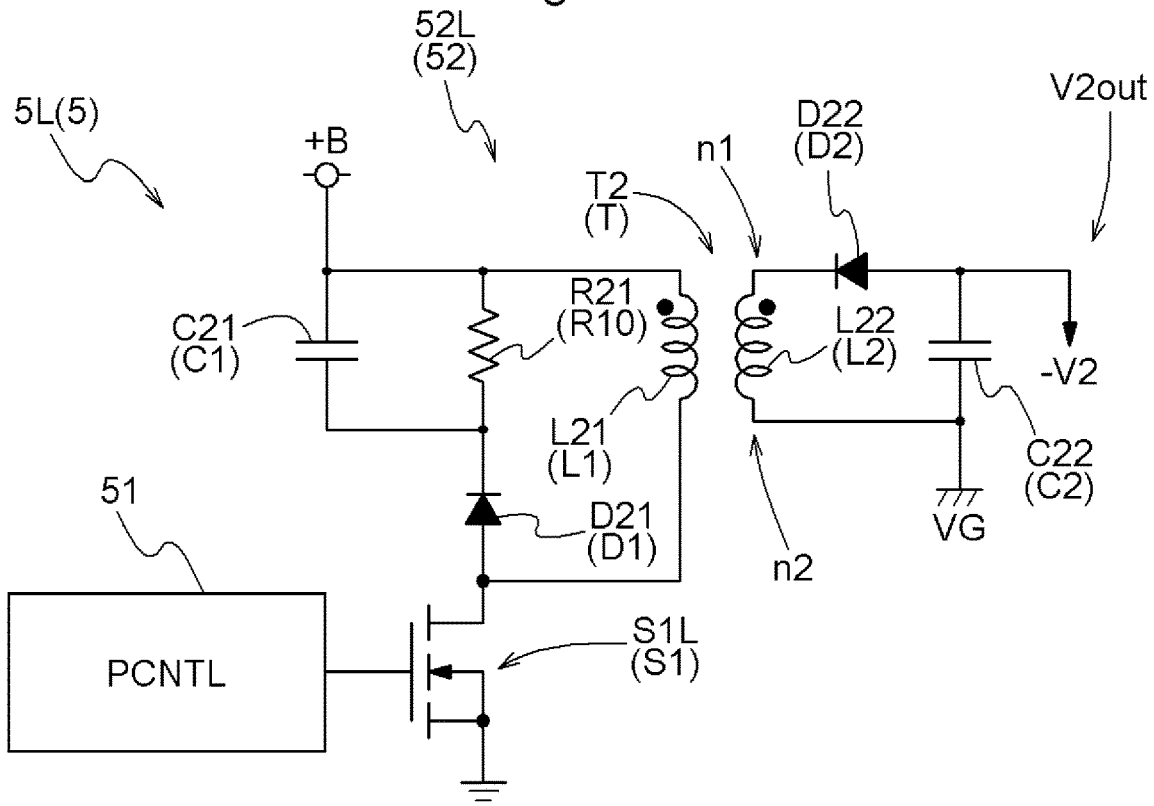
FIG. 5 is a schematic circuit block diagram showing an exemplary configuration of a lower-stage driving voltage generator circuit.

As shown in FIGS. 4 and 5, a driving voltage generator circuit 5 includes an electrical power conversion circuit 52 (52H, 52L) using a transformer T (T1, T2) including a primary coil L1 (L11, L21) and a secondary coil L2 (L12, L22); and a control circuit (PCNTL) 51. FIG. 4 exemplifies a first driving voltage generator circuit 5H that generates the first potential "+V1", and FIG. 5 exemplifies a second driving voltage generator circuit 5L that generates the second potential "−V2". The first driving voltage generator circuit 5H and the second driving voltage generator circuit 5L have the same configuration except for the polarity and number of windings of the coils and the polarity of a secondary diode D2. Therefore, unless a particular distinction is required, the first driving voltage generator circuit 5H and the second driving voltage generator circuit 5L are described as a driving voltage generator circuit 5, using common reference signs. For the control circuit 51, a mode is exemplified in which the plurality of electrical power conversion circuits 52 (52H and 52L) are controlled by the common control circuit 51.

The electrical power conversion circuit 52 includes a primary circuit including the primary coil L1 (L11, L21), a primary resistor R10 (R11, R21), a primary diode D1 (D11, D21), a primary capacitor C1 (C11, C21), and a switching element for power supply control S1 (S1H, S1L); and a secondary circuit including the secondary coil L2 (L12, L22), the secondary diode D2 (D12, D22), and a secondary capacitor C2 (C12, C22). The control circuit 51 controls the passage of current through the primary coil L1 (L11, L21) by switching the switching element for power supply control S1 (S1H, S1L) in the primary circuit. Such a power supply circuit using a transformer is publicly known and thus a detailed description of electrical power conversion operation, etc., is omitted. Note that the primary coil L1 (L11, L21) is connected to the low-voltage system circuit LV, and the secondary coil L2 (L12, L22) is connected to the high-voltage system circuit HV.

Figure 7:
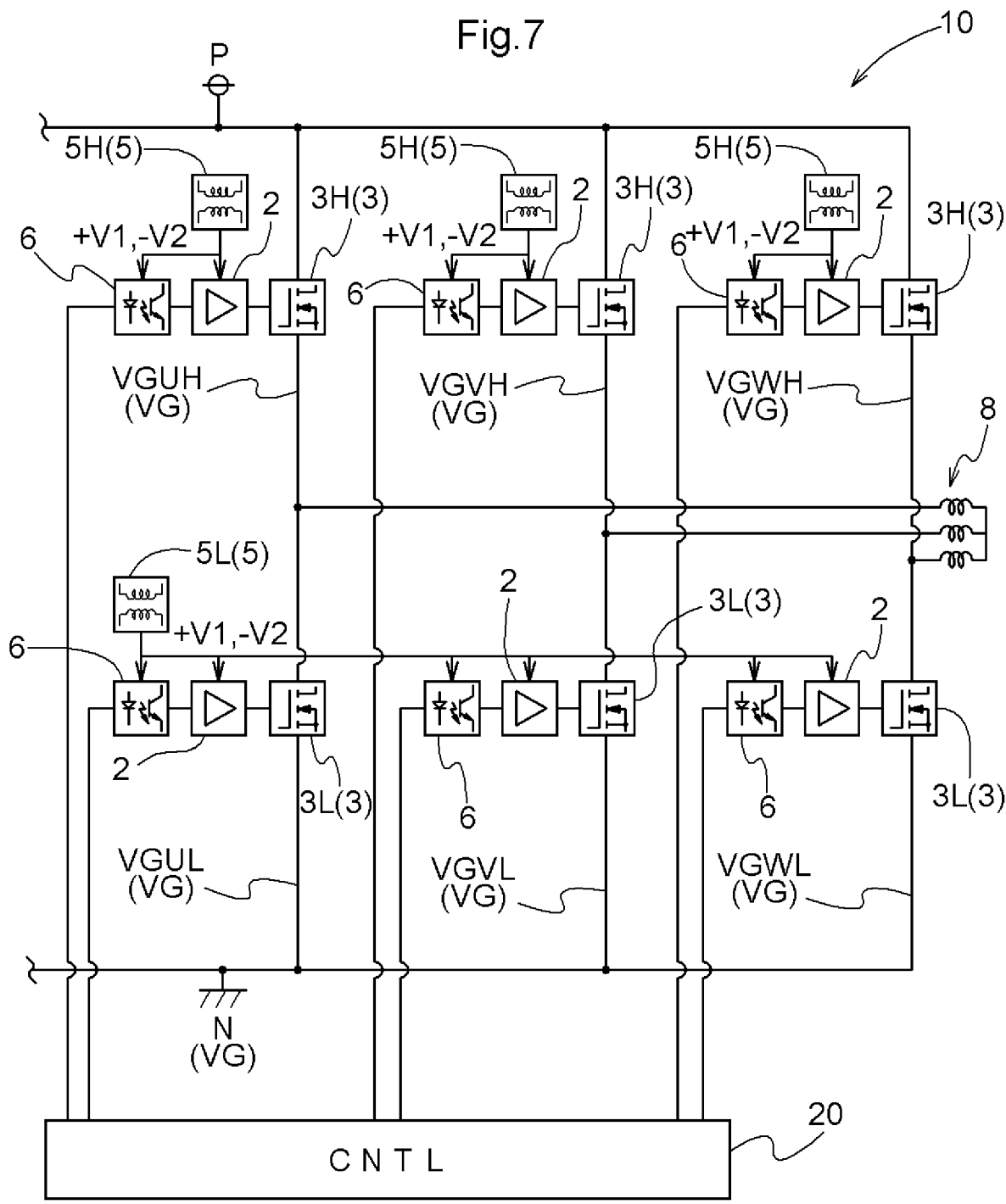
FIG. 7 is a schematic circuit block diagram showing an exemplary configuration of driving voltage generator circuits.

The driving voltage generator circuits 5 independently supply a driving voltage to corresponding driving circuits 2 that transmit a driving signal DS to corresponding switching elements 3. In the present embodiment, the inverter 10 includes six switching elements 3, and six driving circuits 2 are provided accordingly (see FIG. 7). The driving voltage generator circuits 5 are basically provided for the respective driving circuits 2. The ground (virtual ground VG) of the secondary circuit of each driving voltage generator circuit 5 is the potential of a terminal (source terminal S) on the negative polarity "N" side of a corresponding switching element 3. As shown in FIG. 7, virtual grounds VG for the upper-stage switching elements 3H are different potentials (VGUH, VGVH, and VGWH) for the U-, V-, and W-phases. Note, however, that for the lower-stage switching elements 3L, all potentials (VGUL, VGVL, and VGWL) of the terminals on the negative polarity side of the switching elements 3 are the negative polarity "N" of the inverter 10, and their virtual grounds VG are common. Therefore, the second driving voltage generator circuit 5L may be provided so as to be shared between all phases on the lower-stage side (FIG. 7 exemplifies this mode). In this case, as shown in FIG. 7, there are provided four driving voltage generator circuits 5 in total, including three first driving voltage generator circuits 5H and one second driving voltage generator circuit 5L.

Figure 6:
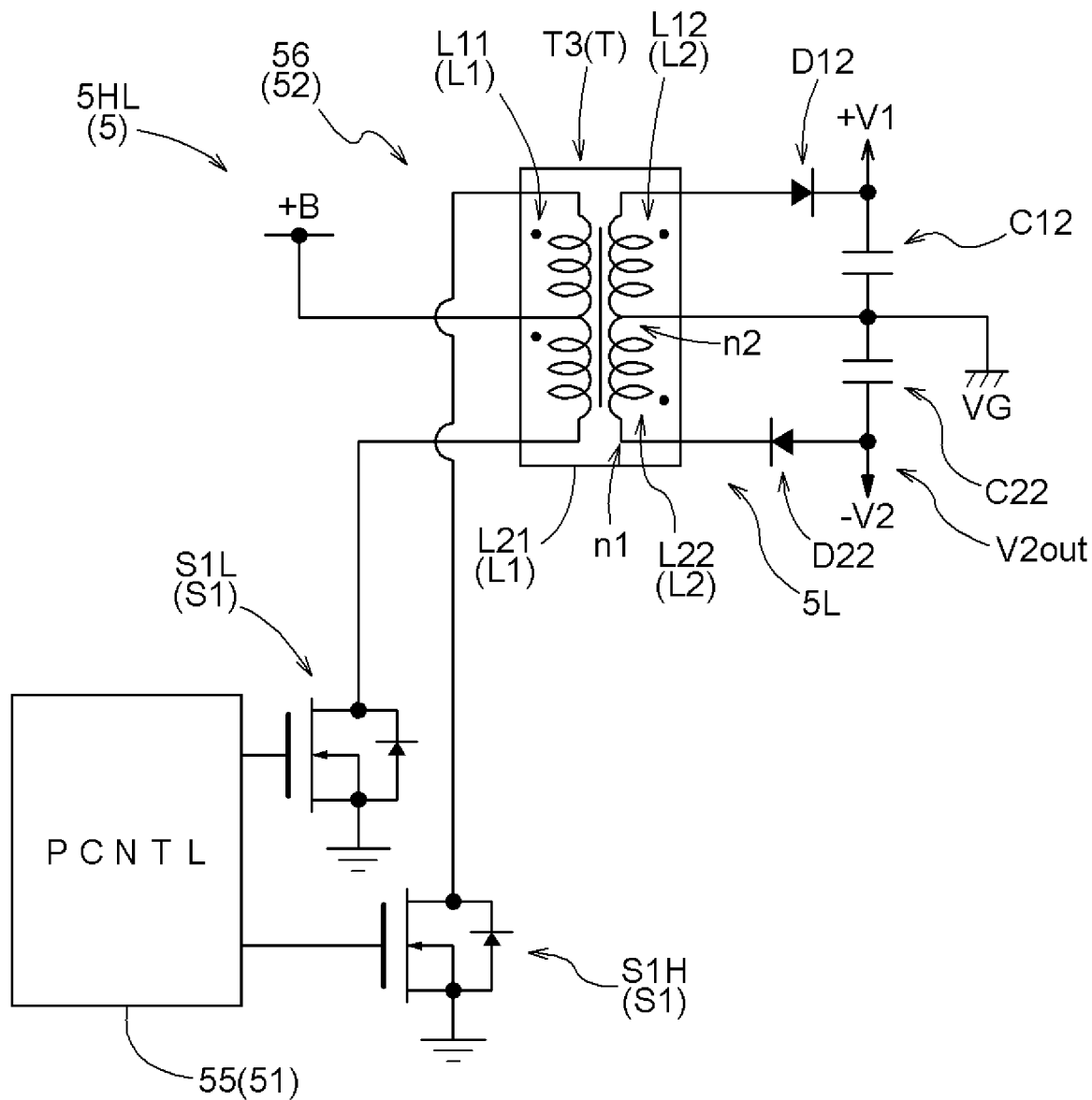
FIG. 6 is a block diagram showing an exemplary configuration of a driving apparatus with a plurality of phases.

Meanwhile, as exemplified in FIG. 6, a driving voltage generator circuit 5 may be configured by a combination of a first driving voltage generator circuit 5H and a second driving voltage generator circuit 5L. FIG. 6 exemplifies a push-pull transformer type electrical power conversion circuit. This driving voltage generator circuit 5 (5HL) includes, as shown in FIG. 6, an electrical power conversion circuit (56) using a transformer T (T3) including primary coils L1 (L11 and L21) and secondary coils L2 (L12 and L22); and a control circuit (55). Note that functionally common configurations are exemplified using common reference signs to those of FIGS. 4 and 5. Such a power supply circuit is also publicly known and thus a detailed description of a circuit configuration, electrical power conversion operation, etc., is omitted. Note that in this case six driving voltage generator circuits 5 (5HL) are provided for six switching elements 3 and for six driving circuits 2.

As such, whichever mode, the one in FIG. 5 or the one in FIG. 6, is used for the driving voltage generator circuit 5 (second driving voltage generator circuit 5L), the driving voltage generator circuit 5 is a transformer circuit including the primary coil L1 and the secondary coil L2. An output-side circuit of a negative power supply (second driving voltage generator circuit 5L) includes the secondary coil L2; a rectifier diode (secondary diode (D22)) connected in a forward direction which is a direction going from an output terminal V2out to a first end n1 of the secondary coil L2; and a capacitor (secondary capacitor (C22)) connected between a second end n2 of the secondary coil L2 which is different from the first end n1 and the output terminal V2out. The second end n2 is connected to the side of a negative polarity (virtual ground VG) of a switching element 3 to be driven. In addition, in the present embodiment, whichever mode, the one in FIG. 5 or the one in FIG. 6, is used for the driving voltage generator circuit 5, the second potential "−V2" is connected to the output terminal V2out of the negative power supply (second driving voltage generator circuit 5L) lower in potential than the side of the negative polarity (virtual ground VG) of the switching element 3 to be driven.

As shown in FIG. 7, the photocouplers 6 for transmission of a switching control signal are also independently provided for the respective switching elements 3, and in the present embodiment, six photocouplers 6 are provided. Each photocoupler includes a light emitting diode and a phototransistor (or a photodiode) which are isolated from each other, and transmits a signal by an optical signal. The light emitting diode on the signal input side of the photocoupler 6 for transmission of a switching control signal is connected to the low-voltage system circuit LV, and the phototransistor (or the photodiode) on the signal output side is connected to the high-voltage system circuit HV. To the phototransistor (or the photodiode) on the signal output side is supplied, for example, generated electrical power from a corresponding driving voltage generator circuit 5 or the high-voltage battery 11 through a regulator circuit which is not shown.

Each driving circuit 2 generates a driving signal DS with the first potential "+V1" or a driving signal DS with the second potential "−V2", according to the logic level of a switching control signal SW outputted from the inverter control apparatus 20 that controls the inverter 10, and transmits the driving signal DS to the control terminal of a corresponding switching element 3. Here, the switching control signal SW outputted from the inverter control apparatus 20 is, as described above, a signal transmitted through a corresponding photocoupler 6 for transmission of a switching control signal.

As shown in FIG. 2, the driving circuit 2 is configured to include the push-pull buffer circuit 21 (emitter follower circuit) including two switching elements (here, transistors (21H and 21L)) which are complementarily switched. Specifically, the driving circuit 2 is configured to include an NPN upper-stage transistor 21H (upper-stage buffer); a PNP lower-stage transistor 21L (lower-stage buffer); a compensation resistor R2; an input-side pull-down resistor R3; an upper-stage current limiting resistor R21H; and a lower-stage current limiting resistor R21L. A collector terminal of the upper-stage transistor 21H is connected to the first potential "+V1" through the upper-stage current limiting resistor R21H, and a collector terminal of the lower-stage transistor 21L is connected to the second potential "−V2" through the lower-stage current limiting resistor R21L. A base terminal of the upper-stage transistor 21H and a base terminal of the lower-stage transistor 21L are connected to each other, and a switching control signal SW (which is an original signal of a switching control signal and is a switching control signal before amplification) is inputted to both base terminals.

As described above, the push-pull buffer circuit 21 is configured such that the switching elements of different polarities are connected in series, as the buffer elements (21H and 21L), between the first potential "+V1" and the second potential "−V2" lower in potential than the first potential "+V1". In the push-pull buffer circuit 21, a connecting point between the control terminals (base terminals B) of the upper-stage buffer element (upper-stage transistor 21H) on the side of the first potential "+V1" and the lower-stage buffer element (lower-stage transistor 21L) on the side of the second potential "−V2" serves as an input part IN (input), and a connecting point between the input and output terminals (emitter terminals E) of the upper-stage buffer element (upper-stage transistor 21H) and the lower-stage buffer element (lower-stage transistor 21L) serves as an output part OUT (output). In addition, the push-pull buffer circuit 21 includes the upper-stage current limiting resistor R21H between the first potential "+V1" and the upper-stage buffer element (upper-stage transistor 21H), and includes the lower-stage current limiting resistor R21L between the second potential "−V2" and the lower-stage buffer element (lower-stage transistor 21L). The switching control signal SW (the original signal of a switching control signal) is inputted to the input part IN, and the output part OUT is connected to a control terminal (gate terminal G) of a switching element 3 to be driven.

Note that the sum of the on-resistance value of the upper-stage transistor 21H and the upper-stage current limiting resistor R21H corresponds to a resistance value between the output part OUT and the first potential "+V1". If the upper-stage current limiting resistor R21H is not installed, the on-resistance value of the upper-stage transistor 21H is a resistance value between the output part OUT and the first potential "+V1". In addition, when the upper-stage current limiting resistor R21H is installed and the on-resistance value of the upper-stage transistor 21H is sufficiently small compared with the upper-stage current limiting resistor R21H, the resistance value between the output part OUT and the first potential "+V1" is substantially equivalent to the resistance value of the upper-stage current limiting resistor R21H.

Likewise, the sum of the on-resistance value of the lower-stage transistor 21L and the lower-stage current limiting resistor R21L corresponds to a resistance value between the output part OUT and the second potential "−V2". If the lower-stage current limiting resistor R21L is not installed, the on-resistance value of the lower-stage transistor 21L is a resistance value between the output part OUT and the second potential "−V2". In addition, when the lower-stage current limiting resistor R21L is installed and the on-resistance value of the lower-stage transistor 21L is sufficiently small compared with the lower-stage current limiting resistor R21L, the resistance value between the output part OUT and the second potential "−V2" is substantially equivalent to the resistance value of the lower-stage current limiting resistor R21L.

The NPN upper-stage transistor 21H and the PNP lower-stage transistor 21L complementarily go into an on state according to the logic level of the switching control signal SW. When the logic level of the switching control signal SW is in a high state, the driving circuit 2 outputs a driving signal DS with the first potential "+V1" and delivers a current to the gate terminal G (control terminal) of the switching element 3 to be driven (push operation). In addition, when the logic level of the switching control signal SW is in a low state, the driving circuit 2 outputs a driving signal DS with the second potential "−V2" and draws a current from the gate terminal G (control terminal) of the switching element 3 to be driven (pull operation).

The upper-stage current limiting resistor R21H and the lower-stage current limiting resistor R21L each are a resistor that limits a current such that a current flowing through the buffer element (the upper-stage transistor 21H, the lower-stage transistor 21L) falls within a rated range in push operation and pull operation. Since a sufficient current to appropriately drive the switching element 3 needs to be flown within the rated range, the resistance values of the upper-stage current limiting resistor R21H and the lower-stage current limiting resistor R21L are generally several Ω (on the order of 10 [Ω] or less). On the other hand, the input-side pull-down resistor R3 has a large resistance value compared with the upper-stage current limiting resistor R21H and the lower-stage current limiting resistor R21L in order to reduce loss at normal operation. In one aspect, the resistance value of the input-side pull-down resistor R3 is set to be 100 or more times larger than the resistance values of the upper-stage current limiting resistor R21H and the lower-stage current limiting resistor R21L. In addition, although it is preferred that the upper-stage current limiting resistor R21H and the lower-stage current limiting resistor R21L have the same value, use of different values is not inhibited. Note that even if the resistance values are different, it is preferred that the resistance value of the input-side pull-down resistor R3 be set to be 100 or more times larger than the resistance value of at least the lower-stage current limiting resistor R21L.

The compensation resistor R2 compensates for voltage drop (0.6 to 0.7 [V]) of the base-collector diodes of the upper-stage transistor 21H and the lower-stage transistor 21L. Therefore, the compensation resistor R2 is set with a resistance value necessary and sufficient for the upper-stage transistor 21H and the lower-stage transistor 21L to transition to an on state by a current provided by the switching control signal SW. Preferably, the resistance value of the compensation resistor R2 is set to be equal to that of the input-side pull-down resistor R3 or to be somewhat smaller than that of the input-side pull-down resistor R3.

As described above, the gate bias resistor R1 of the switching element 3 to be driven does not need to be connected, and thus, the resistance value of the gate bias resistor R1 is a large value of approximately 100 [kΩ] or more. The relationship between the resistance values of the gate bias resistor R1, the compensation resistor R2, the input-side pull-down resistor R3, and the lower-stage current limiting resistor R21L is roughly as follows.

$$R1 > R2 + R3 > R21L$$

As described above, the driving voltage generator circuits 5 generate the first potential "+V1" and the second potential "−V2" from the low-voltage battery 15. Therefore, for example, when electrical power supply from the low-voltage battery 15 is shut off, the first potential "+V1" and the second potential "−V2" cannot be generated. As described above, when the switching element 3 is a SiC-MOSFET, unless the potential of the driving signal DS is the second potential "−V2", the switching element 3 may not be able to be stably controlled to an off state. For example, when the difference between the potential of the driving signal DS and the potential (virtual ground VG) on the negative polarity side of the switching element 3 is on the order of 0 [V], the switching element 3 may go into an on state due to noise, etc., and a current may flow between the source and the drain. If both switching elements 3 of an arm 3A go into an on state when the connection between the high-voltage battery 11 and the inverter 10 is maintained (when the contactors 9 are closed) or when, even if the connection is cut off (the contactors 9 are open), large charge is accumulated in the direct-current link capacitor 4, a large current may flow through the arm 3A due to a short circuit. In addition, when the rotating electrical machine 80 is rotating, a larger current may flow through the arm 3A due to induced electromotive force.

Therefore, even if the driving voltage generator circuit 5 cannot generate the second potential "−V2" when, for example, electrical power supply from the low-voltage battery 15 is shut off, it is desirable that the driving circuit 2 appropriately bring the switching element 3 to an off state.

Figure 3:
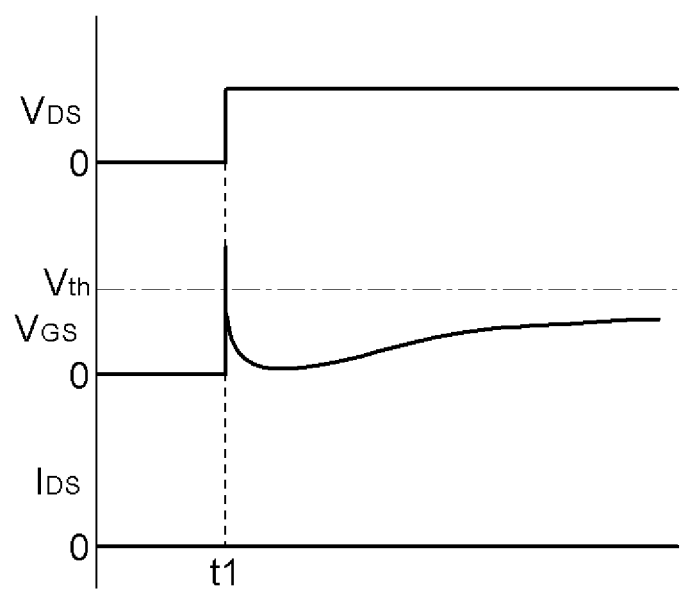
FIG. 3 is a timing chart showing an example of the behavior of a switching element to be driven.

A timing chart of FIG. 3 shows an example of the behavior of a switching element 3 to be driven. Compared to a comparison example which will be described later with reference to FIGS. 9 and 10, at time t1, a drain-source voltage $V_{DS}$ of the switching element 3 suddenly increases, and correspondingly a gate-source voltage $V_{GS}$ increases, and the occurrence of a drain-source current $I_{DS}$ which occurs due to the gate-source voltage $V_{GS}$ exceeding the threshold voltage $V_{th}$ does not nearly exist. A detail will be described later.

Figure 8:
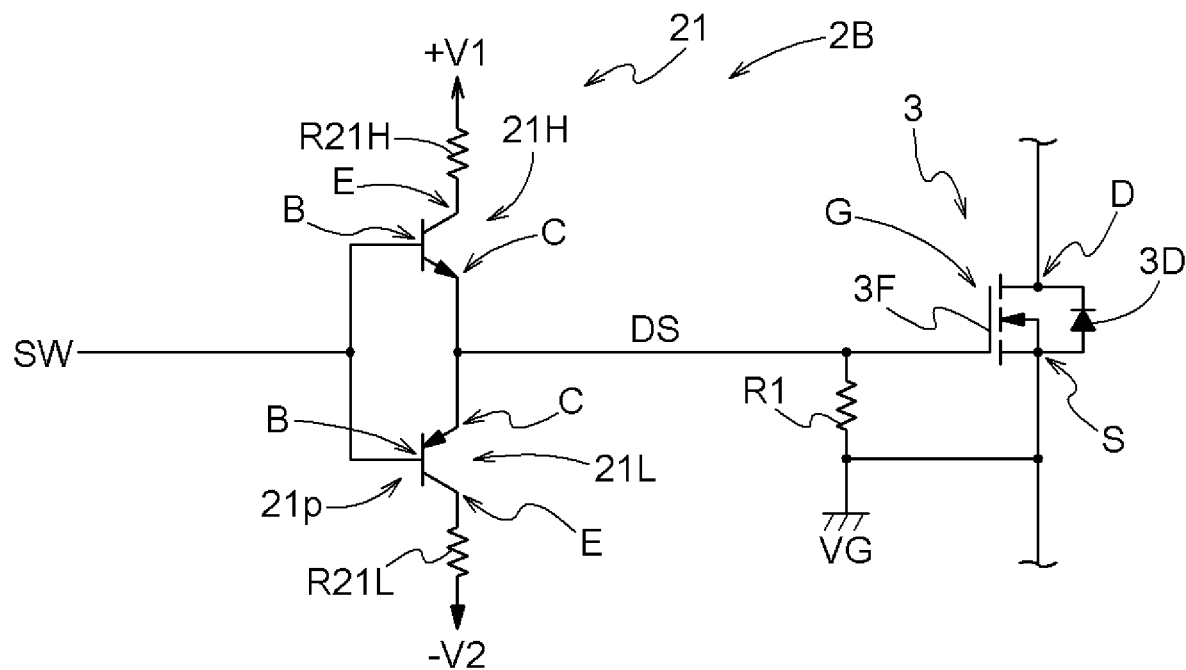
FIG. 8 is a schematic circuit diagram showing a configuration of a comparison example of a driving circuit.

FIG. 8 shows a comparison example of a driving circuit 2 (comparison circuit 2B). Note that for easy comparison, the same configurations as those of the driving circuit 2 are exemplified using the same reference signs as those of FIG. 2. The comparison circuit 2B differs from the driving circuit 2 in that the comparison circuit 2B does not include a compensation resistor R2 and an input-side pull-down resistor R3.

Figure 9:
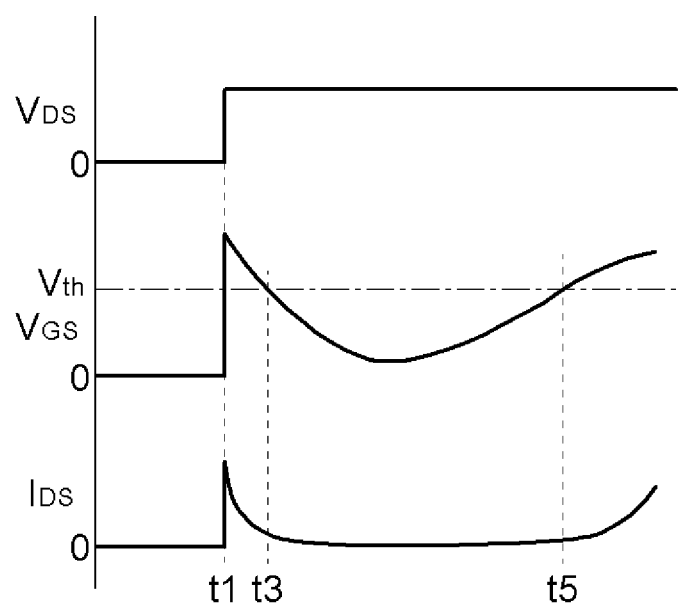
FIG. 9 is a timing chart showing an example of the behavior of a switching element to be driven by the driving circuit of the comparison example.

Timing charts of FIGS. 9 and 10 show examples of the behavior of a switching element 3 to be driven for when the switching element 3 is driven by the comparison circuit 2B. At time t1, when a drain-source voltage $V_{GS}$ of the switching element 3 suddenly increases, a gate-source voltage $V_{GS}$ also suddenly increases due to parasitic capacitances at a gate terminal G (parasitic capacitances between a gate and a drain and between the gate and a source). When the gate-source voltage $V_{GS}$ exceeds the threshold voltage $V_{th}$, the switching element 3 transitions to an on state and a drain-source current $I_{DS}$ flows. Charge of the parasitic capacitances (particularly, charge of the parasitic capacitance between the gate and the drain) is discharged to a negative polarity side (the side of a source terminal S) through a gate bias resistor R1, and the gate-source voltage $V_{GS}$ decreases. With the decrease of the gate-source voltage $V_{GS}$, the drain-source current $I_{DS}$ also decreases, and when the gate-source voltage $V_{GS}$ falls below the threshold voltage $V_{th}$, the drain-source current $I_{DS}$ becomes almost zero (time t3). However, since the drain-source voltage $V_{DS}$ is being applied, a leakage current occurring at the switching element 3 flows through the gate bias resistor R1 and the gate-source voltage $V_{GS}$ occurs. If the leakage current increases, then the voltage at both ends of the gate bias resistor R1, i.e., the gate-source voltage $V_{GS}$, increases and may exceed the threshold voltage $V_{th}$ (time t5).

As described above, the resistance value of the gate bias resistor R1 is a large value of approximately 100 [kΩ] or more. Therefore, even if the current flowing through the gate bias resistor R1 is small, the voltage at both ends of the gate bias resistor R1 tends to increase. As a method for suppressing an increase in the gate-source voltage $V_{GS}$ at and after time t3 caused by a leakage current as described above, it is considered to reduce the resistance value of the gate bias resistor R1. The timing chart of FIG. 10 shows an example of the behavior of the switching element 3 for that case. As is clear from a comparison of FIGS. 9 and 10, the increase in the gate-source voltage $V_{GS}$ caused by a leakage current is suppressed. Note, however, that phenomena occurring at time t1, i.e., the increase in the gate-source voltage $V_{GS}$ and the occurrence of the drain-source current $I_{DS}$ due to the parasitic capacitances, are not suppressed. Therefore, it is not sufficient as measures. In addition, the reduction in the resistance value of the gate bias resistor R1 results in an increase in a current flowing through the gate bias resistor R1 at normal operation, increasing energy loss.

Now, with reference to FIGS. 2 and 3, the behavior of the switching element 3 for when the driving circuit 2 of the present embodiment is applied will be described. At time t1, when a drain-source voltage $V_{DS}$ of the switching element 3 suddenly increases, a gate-source voltage $V_{GS}$ also suddenly increases due to parasitic capacitances at the gate terminal G (parasitic capacitances between the gate and the drain and between the gate and the source). Note, however, that as described above, the sum of the resistance values of the compensation resistor R2 and the input-side pull-down resistor R3 which are connected in series from the gate terminal G to the virtual ground VG of the switching element 3 is small compared with the resistance value of the gate bias resistor R1. The sum of the resistance values of the compensation resistor R2 and the input-side pull-down resistor R3 is preferably on the order of 10 [kΩ], and the resistance value of the gate bias resistor R1 is on the order of 100 [kΩ]. Hence, charge of the parasitic capacitances (particularly, charge of the parasitic capacitance between the gate and the drain) is discharged to the virtual ground VG through the compensation resistor R2 and the input-side pull-down resistor R3.

A potential difference occurs between both ends of the compensation resistor R2 by a current flowing through the compensation resistor R2. By this, a negative voltage is applied between the base and emitter of the upper-stage transistor 21H and the lower-stage transistor 21L of the push-pull buffer circuit 21, and the PNP lower-stage transistor 21L transitions to an on state. The resistance value of the lower-stage current limiting resistor R21L is on the order of several S2 and is very small compared with the sum of the resistance values of the compensation resistor R2 and the input-side pull-down resistor R3 (on the order of 10 [kΩ]) and the resistance value of the gate bias resistor R1 (on the order of 100 [kΩ]). Hence, both of a current associated with the parasitic capacitances and a current associated with a leakage current flow through the lower-stage transistor 21L (flows through the virtual ground VG as will be described later). Hence, the increase in the gate-source voltage $V_{GS}$ at time t1 is also instantaneously eliminated, and the flowing of the drain-source current $I_{DS}$ due to the switching element 3 transitioning to an on state is also suppressed.

Meanwhile, the driving voltage generator circuits 5 generate the first potential "+V1" and the second potential "−V2" from the low-voltage battery 15. Therefore, for example, when electrical power supply from the low-voltage battery 15 is shut off, the first potential "+V1" and the second potential "−V2" cannot be generated. The lower-stage transistor 21L is connected to the second potential "−V2", but in a state in which the driving voltage generator circuit 5 cannot generate the second potential "−V2", the lower-stage transistor 21L is connected to the virtual ground VG through the lower-stage current limiting resistor R21L (a detail will be described later with reference to FIG. 5). Therefore, both of a current associated with the parasitic capacitances and a current associated with the leakage current flow through the virtual ground VG via the lower-stage transistor 21L and the lower-stage current limiting resistor R21L.

As shown in FIG. 5, the output terminal V2out of the second driving voltage generator circuit 5L is connected to the virtual ground VG through the secondary diode D2 (D22) and the secondary coil L2 (L22) which are connected in a forward direction from the output terminal V2out to the virtual ground VG. The lower-stage transistor 21L is connected to the output terminal V2out (second potential "−V2") of the second driving voltage generator circuit 5L through the lower-stage current limiting resistor R21L, and thus is also connected to the virtual ground VG. The same can also be applied to the driving voltage generator circuit 5 (5HL) exemplified in FIG. 6.

SUMMARY OF THE EMBODIMENT

A summary of a switching element driving circuit (2) described above will be briefly described below.

In one aspect of a switching element driving circuit (2) including a push-pull buffer circuit (21) and driving a switching element (3) to be driven, the push-pull buffer circuit (21) amplifying electrical power of a switching control signal (SW) and transmitting the amplified switching control signal (SW) to a control terminal (G) of the switching element (3) to be driven, where in the push-pull buffer circuit (21), switching elements of different polarities are connected in series, as buffer elements (21H and 21L), between a first potential (+V1) and a second potential (−V2) lower in potential than the first potential; a connecting point between control terminals (B) of an upper-stage buffer element (21H) on a side of the first potential (+V1) and a lower-stage buffer element (21L) on a side of the second potential (−V2) serves as an input part (IN); a connecting point between input and output terminals (E) of the upper-stage buffer element (2111) and the lower-stage buffer element (21L) serves as an output part (OUT); an upper-stage current limiting resistor (R21H) is provided between the first potential (+V1) and the upper-stage buffer element (21H); a lower-stage current limiting resistor (R21L) is provided between the second potential (−V2) and the lower-stage buffer element (21L); the switching control signal (SW) is inputted to the input part (IN); and the output part (OUT) is connected to the control terminal (G) of the switching element (3) to be driven, the switching element driving circuit (2) further includes: a compensation resistor (R2) that connects the input part (IN) to the output part (OUT); and an input-side pull-down resistor (R3) that connects the input part (IN) to a negative polarity (VG) side of the switching element (3) to be driven, and a sum of a resistance value of the compensation resistor (R2) and a resistance value of the input-side pull-down resistor (R3) is set to be smaller than a resistance value (R1) between the control terminal (G) of the switching element (3) to be driven and an emitter terminal or a source terminal (S) of the switching element (3), and to be larger than a resistance value of the lower-stage current limiting resistor (R21L).

When a voltage is applied between the input and output terminals (between a drain and a source or between a collector and an emitter) of a switching element (3) to be driven, due to floating capacitances at a control terminal (a gate terminal (G) or a base terminal (B)), a driving voltage at the control terminal (a gate-source voltage ($V_{GS}$), a gate-emitter voltage, or a base-emitter voltage) may suddenly increase. The switching element driving circuit (2) includes a series circuit of the compensation resistor (R2) and the input-side pull-down resistor (R3) between the control terminal (G) and the negative polarity (VG). The sum of the resistance value of the compensation resistor (R2) and the resistance value of the input-side pull-down resistor (R3) is smaller than a resistance value (R1) between the control terminal (G) and the emitter terminal or the source terminal (S) of the switching element (3). Therefore, charge of the parasitic capacitances is discharged to the negative polarity (VG) of the switching element (3) to be driven, through the compensation resistor (R2) and the input-side pull-down resistor (R3). At this time, a potential difference occurs between both ends of the compensation resistor (R2) by a current flowing through the compensation resistor (R2), and the lower-stage buffer element (21L) of the push-pull buffer circuit (21) transitions to an on state. The resistance value of the lower-stage current limiting resistor (R21L) is smaller than the sum of the resistance value of the compensation resistor (R2) and the resistance value of the input-side pull-down resistor (R3). Therefore, when the lower-stage buffer element (21L) transitions to an on state, charge of the floating capacitances and a leakage current flowing through the switching element (3) to be driven flow through the lower-stage buffer element (21L) and the lower-stage current limiting resistor (R21L). By this, a voltage that allows the switching element (3) to be driven to transition to an on state is suppressed from occurring at the control terminal of the switching element (3). As such, according to this configuration, even when electrical power supply to the driving circuit (2) that amplifies a switching control signal (SW) and transmits the amplified switching control signal (SW) to the switching element (3) is stopped, the switching element (3) can be appropriately controlled to an off state.

Here, it is preferred that the second potential (−V2) be connected to an output terminal (V2out) of a negative power supply (5L) lower in potential than the negative polarity (VG) side of the switching element (3) to be driven, the negative power supply (5) be a transformer circuit including a primary coil (L21) and a secondary coil (L22), an output-side circuit of the negative power supply (5L) include the secondary coil (L22); a rectifier diode (D22) connected in a forward direction, the forward direction being a direction going from the output terminal (V2out) to a first end (n1) of the secondary coil (L22); and a capacitor (C22) connected between a second end (n2) of the secondary coil (L22) and the output terminal (V2out), the second end (n2) being different from the first end (n1), and the second end (n2) be connected to the negative polarity (VG) side of the switching element (3) to be driven.

According to this configuration, even when electrical power supply to the negative power supply (5L) is shut off, the output terminal (V2out) of the negative power supply (5L) is connected to the negative polarity (VG) of the switching element (3) to be driven, through the rectifier diode (D22) and the secondary coil (L22) which are connected in the forward direction from the output terminal (V2out) to the negative polarity (VG). The lower-stage transistor (21L) is connected to the output terminal (V2out (second potential (−V2)) of the negative power supply (5L) through the lower-stage current limiting resistor (R21L), and thus is also connected to the negative polarity (VG). Therefore, even when the negative power supply (5L) is not functioning normally and thus stops electrical power supply to the driving circuit (2), a current is led to the negative polarity (VG) of the switching element (3) to be driven, and the switching element (3) can be appropriately controlled to an off state.

In addition, it is preferred that the resistance value of the input-side pull-down resistor (R3) be set to be 100 or more times larger than the resistance value of the lower-stage current limiting resistor (R21L).

According to this configuration, the resistance value of a path to the negative polarity (VG) of the switching element (3) to be driven, through the lower-stage buffer element (21L) is much smaller than the resistance value of a path to the negative polarity (VG) through the input-side pull-down kesistor (R3). Therefore, a current is led to the negative polarity (VG) of the switching element (3) to be driven, through the lower-stage buffer element (21L), and the switching element (3) can be appropriately controlled to an off state.

The invention claimed is:

1. A switching element driving circuit comprising
a push-pull buffer circuit driving a switching element to be driven, the push-pull buffer circuit amplifying electrical power of a switching control signal and transmitting the amplified switching control signal to a control terminal of the switching element to be driven, wherein:
in the push-pull buffer circuit, switching elements of different polarities are connected in series, as buffer elements, between a first potential and a second potential lower in potential than the first potential;
a connecting point between control terminals of an upper-stage buffer on a side of the first potential and a lower-stage buffer on a side of the second potential serves as an input;
a connecting point between input and output terminals of the upper-stage buffer and the lower-stage buffer serves as an output;
an upper-stage current limiting resistor is provided between the first potential and the upper-stage buffer;

a lower-stage current limiting resistor is provided between the second potential and the lower-stage buffer;

the switching control signal is inputted to the input; and the output is connected to the control terminal of the switching element to be driven, a compensation resistor that connects the input to the output; and an input-side pull-down resistor that connects the input to a negative polarity side of the switching element to be driven, wherein a sum of a resistance value of the compensation resistor and a resistance value of the input-side pull-down resistor is set to be smaller than a resistance value between the control terminal of the switching element to be driven and an emitter terminal or a source terminal of the switching element, and to be larger than a resistance value of the lower-stage current limiting resistor.

2. The switching element driving circuit according to claim 1, wherein the second potential is connected to an output terminal of a negative power supply lower in potential than the negative polarity side of the switching element to be driven, the negative power supply is a transformer circuit including a primary coil and a secondary coil, an output-side circuit of the negative power supply includes the secondary coil; a rectifier diode connected in a forward direction, the forward direction being a direction going from the output terminal to a first end of the secondary coil; and a capacitor connected between a second end of the secondary coil and the output terminal, the second end being different from the first end, and the second end is connected to the negative polarity side of the switching element to be driven.

3. The switching element driving circuit according to claim 1, wherein the resistance value of the input-side pull-down resistor is set to be 100 or more times larger than the resistance value of the lower-stage current limiting resistor.

* * * * *